United States Patent
Zuo et al.

(10) Patent No.: US 9,930,783 B2
(45) Date of Patent: Mar. 27, 2018

(54) PASSIVE DEVICE ASSEMBLY FOR ACCURATE GROUND PLANE CONTROL

(71) Applicant: QUALCOMM Incorporated, San Diego, CA (US)

(72) Inventors: Chengjie Zuo, San Diego, CA (US); David Francis Berdy, San Diego, CA (US); Daeik Daniel Kim, Del Mar, CA (US); Changhan Hobie Yun, San Diego, CA (US); Mario Francisco Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 152 days.

(21) Appl. No.: 15/079,811

(22) Filed: Mar. 24, 2016

(65) Prior Publication Data

US 2017/0280562 A1    Sep. 28, 2017

(51) Int. Cl.
*H05K 7/00* (2006.01)
*H05K 1/18* (2006.01)
*H03H 7/01* (2006.01)
*H05K 3/30* (2006.01)
*H05K 3/40* (2006.01)
(Continued)

(52) U.S. Cl.
CPC .......... *H05K 1/181* (2013.01); *H03H 7/0138* (2013.01); *H05K 3/10* (2013.01); *H05K 3/303* (2013.01);
(Continued)

(58) Field of Classification Search
CPC .......... H05K 1/181; H05K 2201/09227; H01L 21/56; H01L 23/28; H01L 31/0203; H01L 33/52; H01L 23/12; H01L 23/15
(Continued)

(56) References Cited

U.S. PATENT DOCUMENTS 7,613,007 B2 * 11/2009 Amey, Jr. ......... H01L 23/49822
361/760
8,362,599 B2   1/2013 Kim et al.
(Continued)

FOREIGN PATENT DOCUMENTS

WO   2015142591 A1   9/2015

OTHER PUBLICATIONS

International Search Report and Written Opinion for PCT/US2017/020601, dated Jul. 13, 2017, 14 pages.

*Primary Examiner* — Binh Tran
(74) *Attorney, Agent, or Firm* — W&T/Qualcomm

(57) ABSTRACT

Passive device assembly for accurate ground plane control is disclosed. A passive device assembly includes a device substrate conductively coupled to a ground plane separation control substrate. A passive device disposed on a lower surface of the device substrate is separated from an embedded ground plane mounted on a lower surface of the ground plane separation control substrate by a separation distance. The separation distance is accurately controlled to minimize undesirable interference that may occur to the passive device. The separation distance is provided inside the passive device assembly. Conductive mounting pads are disposed on the lower surface of the ground plane separation control substrate to support accurate alignment of the passive device assembly on a circuit board. By providing sufficient separation distance inside the passive device assembly, the passive device assembly can be precisely mounted onto any circuit board regardless of specific design and layout of the circuit board.

37 Claims, 7 Drawing Sheets

(51) Int. Cl.
*H05K 3/10* (2006.01)
*H05K 1/11* (2006.01)
*H05K 1/14* (2006.01)
*H01L 23/12* (2006.01)
*H01L 21/56* (2006.01)
*H01L 23/15* (2006.01)
*H01L 23/28* (2006.01)

(52) U.S. Cl.
CPC ............ *H05K 3/4007* (2013.01); *H01L 21/56* (2013.01); *H01L 23/12* (2013.01); *H01L 23/15* (2013.01); *H01L 23/28* (2013.01); *H05K 2201/09227* (2013.01)

(58) Field of Classification Search
USPC ............... 361/760, 767, 777, 782, 783, 784; 257/697, 787, 788
See application file for complete search history.

(56) References Cited

U.S. PATENT DOCUMENTS

| | | | |
|---|---|---|---|
| 9,059,304 | B2 | 6/2015 | Meyer et al. |
| 9,257,393 | B1 | 2/2016 | Gong et al. |
| 2009/0008765 | A1* | 1/2009 | Yamano .................. H01L 24/83 257/690 |
| 2009/0302436 | A1 | 12/2009 | Kim et al. |
| 2011/0204494 | A1* | 8/2011 | Chi ........................ H01L 21/56 257/659 |
| 2014/0048906 | A1 | 2/2014 | Shim et al. |
| 2014/0138816 | A1 | 5/2014 | Lu et al. |
| 2014/0138826 | A1* | 5/2014 | Kumar .................. H01L 25/105 257/738 |
| 2015/0201495 | A1 | 7/2015 | Kim et al. |
| 2015/0271920 | A1 | 9/2015 | Kim et al. |
| 2016/0073496 | A1 | 3/2016 | Vincent |

\* cited by examiner

PASSIVE DEVICE ASSEMBLY FOR ACCURATE GROUND PLANE CONTROL

BACKGROUND

I. Field of the Disclosure

The technology of the disclosure relates generally to semiconductor packaging of semiconductor dies and passive components, and more specifically to minimizing undesirable inductance interference between the passive components and a ground plane of circuit board to which the semiconductor package is mounted.

II. Background

Semiconductor packages typically involve one or more semiconductor dies integrated on a substrate, such as a glass substrate. The substrate is then attached to a package base, such as a printed circuit board (PCB). Passive components such as capacitors and inductors are usually formed on one side, such as a lower side, of the substrate. The substrate may be attached to the PCB, face down, such that the lower side having the passive components is closest to the PCB. Ball grid arrays (BGAs) including solder balls may be utilized for forming the connections and attachment between the substrate and the PCB. Electrical connections between the PCB and the substrate may be formed with wire bonds and pads.

For example, with reference to FIG. 1, a side view of a conventional semiconductor package 100 is illustrated. The conventional semiconductor package 100 includes a glass substrate 102 with an inductor 104 attached on a lower surface 106 of the glass substrate 102. The combination of the glass substrate 102 with the inductor 104 is referred to as a two-dimensional (2D) passive-on-glass (POG) structure. The 2D POG structure is attached to a PCB 108 using solder balls 110 that form one or more BGAs 112. The PCB 108 includes a ground plane 114. For example, the ground plane 114 may be a large area of copper foil which is connected to a ground terminal (not shown) of the PCB 108, and serves as a ground or return path for current from the various components integrated on the PCB 108.

With continuing reference to FIG. 1, the inductor 104 is vertically separated from the ground plane 114 by a separation distance $D_0$. An increased separation distance $D_0$ minimizes undesirable inductance interference and accompanying quality factor (Q-factor) degradation between the inductor 104 and the ground plane 114. A conventional approach for fabricating the conventional semiconductor package 100 relies on the BGAs 112 to control the separation distance $D_0$ between the inductor 104 and the ground plane 114 in the PCB 108. However, it may be difficult to achieve a desired and consistent height $H_0$ of the solder balls 110 that form the BGAs 112. In addition, the solder balls 110 may also tend to be highly susceptible to reflow degradation, which can cause the separation distance $D_0$ to vary (e.g., decrease), as a result. Furthermore, over the course of operation, the reflow degeneration of the solder balls 110 may lead to collapse of the 2D POG structure in the conventional semiconductor package 100 due to high heat and stress that is common in semiconductor packages like the conventional semiconductor package 100. In this regard, there is a need for efficient and reliable integration of the 2D POG structure to avoid the aforementioned problems.

SUMMARY OF THE DISCLOSURE

Aspects disclosed herein include passive device assembly for accurate ground plane control. In one aspect, a passive device assembly is provided that includes a passive device(s) (e.g., an inductor(s) and/or a capacitor(s)) for use in a circuit, such as a radio-frequency (RF) filter for example. The passive device assembly includes a device substrate and a ground plane separation control substrate. The device substrate is disposed above and conductively coupled to the ground plane separation control substrate. A passive device(s) disposed on a lower surface of the device substrate is separated from an embedded ground plane mounted on a lower surface of the ground plane separation control substrate by a separation distance. The separation distance is accurately controlled by controlling the height of the ground plane separation control substrate to minimize or eliminate undesirable inductance interference that may occur between the passive device(s) and the embedded ground plane. In this manner, the separation distance is controlled by structures that are contained with the passive device assembly. In another aspect, conductive mounting pads are disposed on the lower surface of the ground plane separation control substrate to support accurate alignment of the passive device assembly on a circuit board. By providing sufficient separation distance inside the passive device assembly to minimize undesirable inductance interference that may occur between the passive device(s) and the embedded ground plane, the passive device assembly can be precisely mounted onto any circuit board regardless of specific design and layout of the circuit board.

In this regard in one aspect, a passive device assembly is provided. The passive device assembly comprises a device substrate comprising an upper surface and a lower surface. The passive device assembly also comprises at least one passive device disposed on the lower surface of the device substrate. The passive device assembly also comprises a ground plane separation control substrate comprising an upper surface and a lower surface, the ground plane separation control substrate having a first height. The passive device assembly also comprises an embedded ground plane mounted on the lower surface of the ground plane separation control substrate. The lower surface of the device substrate is conductively coupled to the upper surface of the ground plane separation control substrate to control a separation distance between the at least one passive device and the embedded ground plane that is at least the first height of the ground plane separation control substrate. The passive device assembly also comprises one or more conductive mounting pads disposed on the lower surface of the ground plane separation control substrate and conductively coupled to the ground plane separation control substrate for conductively mounting the passive assembly device on a circuit board to conductively couple the at least one passive device to a circuit in the circuit board.

In another aspect, a passive device assembly is provided. The passive device assembly comprises a means for disposing at least one passive device. The passive device assembly also comprises a means for mounting an embedded ground plane, the mounting the embedded ground plane having a first height. The passive device assembly also comprises a means for conductively coupling the means for disposing the at least one passive device to the means for mounting the embedded ground plane and controlling a separation distance between the at least one passive device and the embedded ground plane to be at least the first height of the means for mounting the embedded ground plane. The passive device assembly also comprises a means for conductively coupling the at least one passive device to one or more circuits in a circuit board.

In another aspect, a method for fabricating a passive device assembly is provided. The method comprises disposing at least one passive device on a lower surface of a device substrate. The method also comprises mounting an embedded ground plane on a lower surface of a ground plane separation control substrate having a first height. The method also comprises conductively coupling the lower surface of the device substrate to an upper surface of the ground plane separation control substrate and controlling a separation distance between the at least one passive device and the embedded ground plane to be at least the first height of the ground plane separation control substrate. The method also comprises disposing one or more conductive mounting pads on the lower surface of the ground plane separation control substrate and conductively coupling the one or more conductive mounting pads to the ground plane separation control substrate.

In another aspect, a circuit assembly is provided. The circuit assembly comprises a passive device assembly. The passive device assembly comprises a device substrate comprising an upper surface and a lower surface. The passive device assembly also comprises at least one passive device disposed on the lower surface of the device substrate. The passive device assembly also comprises a ground plane separation control substrate comprising an upper surface and a lower surface, the ground plane separation control substrate having a first height. The passive device assembly also comprises an embedded ground plane mounted on the lower surface of the ground plane separation control substrate. The lower surface of the device substrate is conductively coupled to the upper surface of the ground plane separation control substrate to control a separation distance between the at least one passive device and the embedded ground plane that is at least the first height of the ground plane separation control substrate. The passive device assembly also comprises one or more conductive mounting pads disposed on the lower surface of the ground plane separation control substrate and conductively coupled to the ground plane separation control substrate. The circuit assembly also comprises a circuit board comprising one or more circuits and one or more conductive redistribution pads electrically coupled to the one more circuits. The one or more conductive mounting pads disposed on the lower surface of the ground plane separation control substrate are conductively mounted to the one or more conductive redistribution pads to conductively couple the at least one passive device to the one or more circuits in the circuit board.

DETAILED DESCRIPTION

Figure 1:
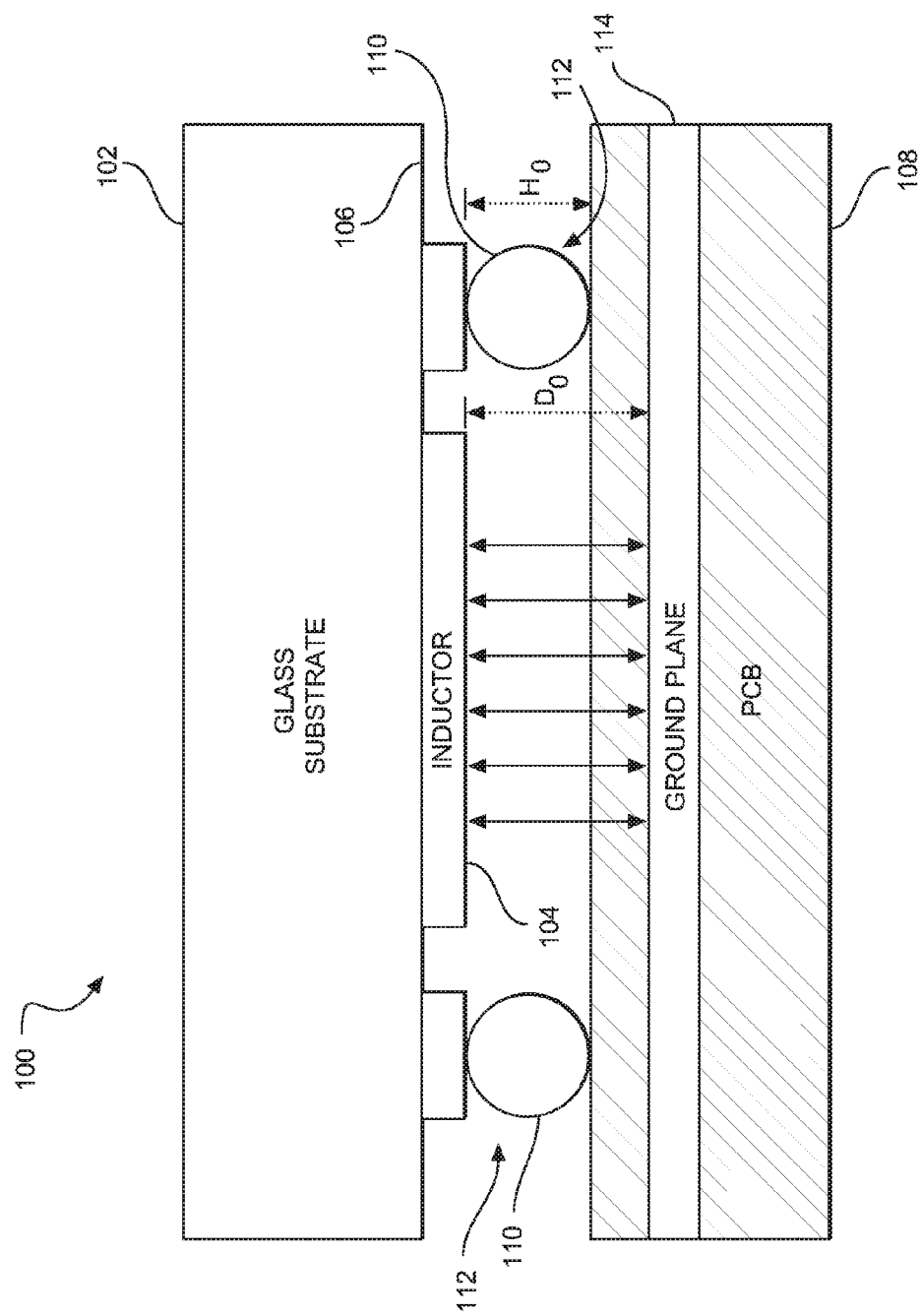
FIG. 1 is a schematic diagram of a conventional semiconductor package.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include passive device assembly for accurate ground plane control. In one aspect, a passive device assembly is provided that includes a passive device(s) (e.g., an inductor(s) and/or a capacitor(s)) for use in a circuit, such as a radio-frequency (RF) filter for example. The passive device assembly includes a device substrate and a ground plane separation control substrate. The device substrate is disposed above and conductively coupled to the ground plane separation control substrate. A passive device(s) disposed on a lower surface of the device substrate is separated from an embedded ground plane mounted on a lower surface of the ground plane separation control substrate by a separation distance. The separation distance is accurately controlled by controlling the height of the ground plane separation control substrate to minimize or eliminate undesirable inductance interference that may occur between the passive device(s) and the embedded ground plane. In this manner, the separation distance is controlled by structures that are contained with the passive device assembly. In another aspect, conductive mounting pads are disposed on the lower surface of the ground plane separation control substrate to support accurate alignment of the passive device assembly on a circuit board. By providing sufficient separation distance inside the passive device assembly to minimize undesirable inductance interference that may occur between the passive device(s) and the embedded ground plane, the passive device assembly can be precisely mounted onto any circuit board regardless of specific design and layout of the circuit board.

Figure 2:
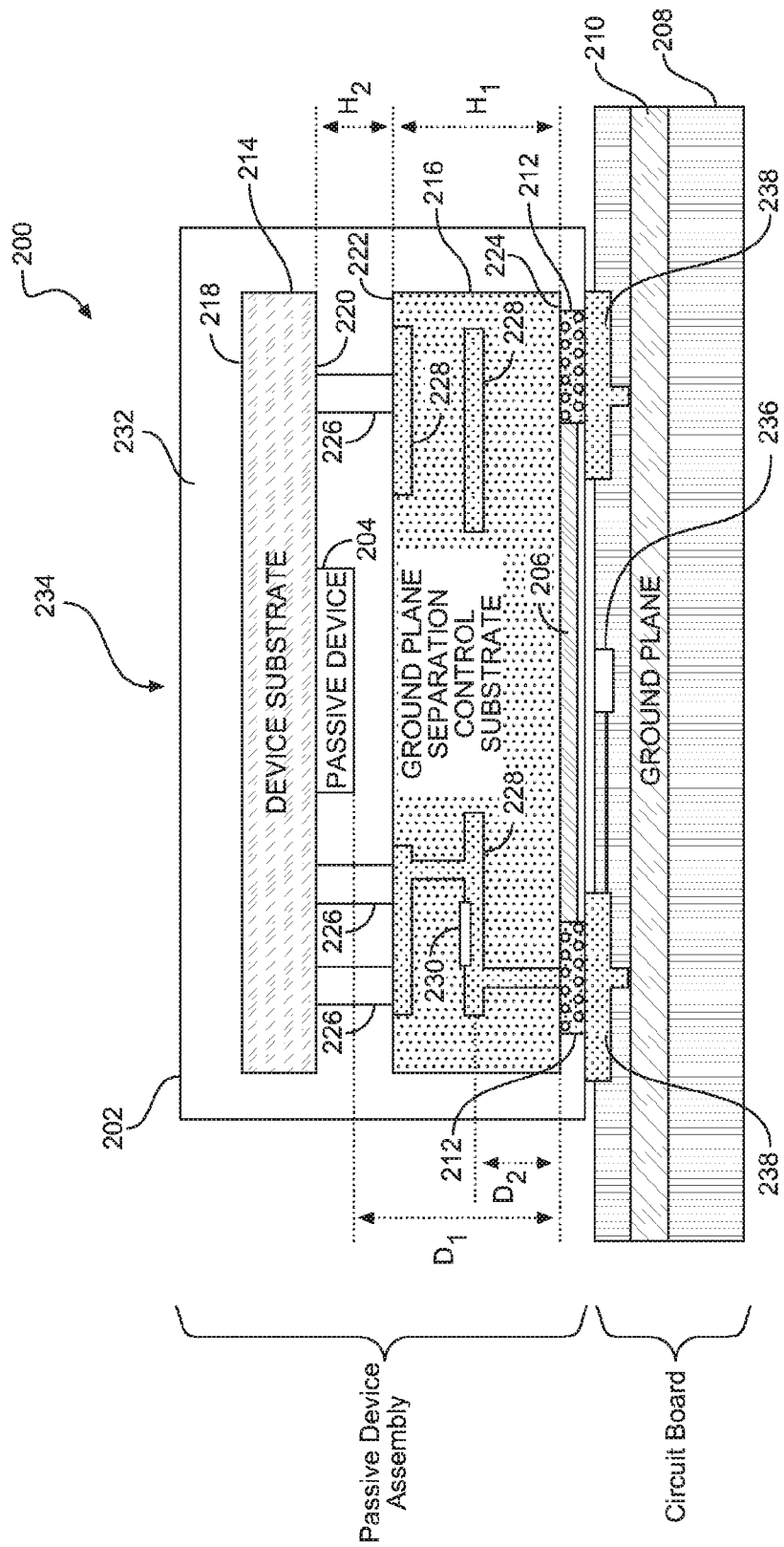
FIG. 2 is a schematic diagram of an exemplary circuit assembly including a passive device assembly configured to provide accurate ground plane control to minimize undesirable interference to at least one passive device provided in the passive device assembly by a ground plane.

In this regard, FIG. 2 is a schematic diagram of an exemplary circuit assembly 200 including a passive device assembly 202 configured to provide accurate ground plane control to minimize undesirable interference with at least one passive device 204 provided in the passive device assembly 202. As discussed in more detail below, an embedded ground plane 206 is included in the passive device assembly 202 to enable accurate ground plane control to minimize the undesirable interference to the passive device 204. By including the embedded ground plane 206 inside the passive device assembly 202, it is possible to accurately control a separation distance $D_1$ between the passive device 204 and the embedded ground plane 206 to minimize the undesirable interference to the passive device 204. As a result, the passive device assembly 202 may be provided on a circuit board 208, which may be a printed circuit board (PCB) for example, regardless of the exact location of a ground plane 210 in the circuit board 208. This is contrasted with the conventional semiconductor package 100 in FIG. 1, wherein the location of the ground plane 114 inside the PCB 108 may vary from manufacturer to manufacturer, thus making it difficult to predict the exact location of the ground plane 114 and control the separation distance $D_0$ accurately. In the exemplary passive device assembly 202, the exact location of the ground plane 210 is not controlling the separation distance $D_1$ inside the passive device assembly 202, thus allowing the passive device assembly 202 to be mounted onto the circuit board 208 via one or more conductive mounting pads 212 for pin compatibility and precise alignment. In one non-limiting example, as discussed in more detail below, the one or more conductive mounting pads 212 may be one or more pin grid array (PGA) pads for providing self-alignment of the passive device assembly 202 to the circuit board 208 when mounted thereon.

With continuing reference to FIG. 2, the passive device assembly 202 includes a device substrate 214 and a ground plane separation control substrate 216. The ground plane separation control substrate 216 may be a substrate that supports the embedded ground plane 206. The ground plane separation control substrate 216 is placed between the device substrate 214 and the circuit board 208 to control the separation distance $D_1$ between the embedded ground plane 206 and the passive device 204 supported by the device substrate 214. In a non-limiting example, the device substrate 214 and the ground plane separation control substrate 216 may be configured to provide a means for disposing the passive device 204 and a means for mounting the embedded ground plane 206, respectively. The device substrate 214 has an upper surface 218 and a lower surface 220. The ground plane separation control substrate 216 is of a first height $H_1$, and has an upper surface 222 and a lower surface 224. The passive device 204 is disposed on the lower surface 220 of the device substrate 214. The embedded ground plane 206 is mounted on the lower surface 224 of the ground plane separation control substrate 216.

The device substrate 214 is disposed above the ground plane separation control substrate 216. The lower surface 220 of the device substrate 214 is conductively coupled to the upper surface 222 of the ground plane separation control substrate 216. In a non-limiting example, the lower surface 220 of the device substrate 214 may be conductively coupled to the upper surface 222 of the ground plane separation control substrate 216 by a plurality of conductive structures 226 disposed between the lower surface 220 of the device substrate 214 and the upper surface 222 of the ground plane separation control substrate 216. Each of the plurality of conductive structures 226 has a second height $H_2$, as illustrated in FIG. 2. In a non-limiting example, the plurality of conductive structures 226 may be formed by bonding materials such as gold (Au). In a non-limiting example, the plurality of conductive structures 226 may be configured to provide a means for conductively coupling the means for disposing the passive device 204 to the means for mounting the embedded ground plane 206 and controlling the separation distance $D_1$ between the passive device 204 and the embedded ground plane 206 to be at least the first height $H_1$ of the means for mounting the embedded ground plane 206.

The separation distance $D_1$ between the passive device 204 and the embedded ground plane 206 may be controlled to be at least the first height $H_1$ ($D_1 \geq H_1$). In this regard, in a non-limiting example, it may also be possible to control the separation distance $D_1$ by controlling the first height $H_1$ and the second height $H_2$.

With continuing reference to FIG. 2, in a non-limiting example, the ground plane separation control substrate 216 may be a semiconductor substrate. In this regard, in addition to providing support for the embedded ground plane 206 for controlling the separation distance $D_1$, the ground plane separation control substrate 216 may also include at least one conductive layer 228 that is conductively coupled to the one or more conductive mounting pads 212. In a non-limiting example, the conductive layer 228 may include at least one metal layer 228. In another non-limiting example, it is possible to dispose at least one secondary passive device 230 on the conductive layer 228. As such, the passive device assembly 202 may be fabricated not only including the passive device 204 disposed on the lower surface 220 of the device substrate 214, but also including the secondary passive device 230 disposed in the ground plane separation control substrate 216. In this regard, by providing the secondary passive device 230 on the conductive layer 228, the passive device assembly 202 can be configured to include the passive device 204 and the secondary passive device 230. In some applications, for example, it may be necessary to provide multiple passive devices, for example four passive devices, in the passive device assembly 202. In this regard, if the four passive devices are all disposed on the lower surface 220 of the device substrate 214, the footprint of the device substrate 214 needs to be increased to accommodate the four passive devices. In contrast, if two of the four passive devices can be disposed on the conductive layer 228 in the ground plane separation control substrate 216, for example, the footprint of the passive device 204 required to accommodate the four passive devices in the passive device assembly 202 may be reduced by half. As illustrated in FIG. 2, the secondary passive device 230 is separated from the embedded ground plane 206 by a second separation distance $D_2$ that is shorter than the separation distance $D_1$ ($D_2 < D_1$). As such, the secondary passive device 230 may be less susceptible to the undesirable interference than the passive device 204. In this regard, in a non-limiting example, the secondary passive device 230 may perform similar or distinct functions as the passive device 204, but with a lower quality factor (Q-factor) than the passive device 204.

With continuing reference to FIG. 2, in a non-limiting example, the ground plane separation control substrate 216 may also be an organic substrate. By being provided as the organic substrate, it is possible to support organic nanowire structures (not shown) for providing conductivity between the device substrate 214 and the circuit board 208. In addition, it may be possible to fabricate organic devices, such as organic field effect transistors (OFETs), into the ground plane separation control substrate 216 as part of a circuit (not shown) formed by or including the passive device 204, if desired.

The passive device assembly 202 also includes an overmolding 232 disposed around the device substrate 214 and the ground plane separation control substrate 216 to form a passive device package 234. The overmolding 232 encapsulates the passive device assembly 202 to protect the passive device 204 and the secondary passive device 230 in the passive device assembly 202. In this regard, the passive device assembly 202 may be dropped onto the circuit board 208 without being damaged. In a non-limiting example, the overmolding 232 may be provided with overmold material, such as plastic.

With continuing reference to FIG. 2, the circuit board 208 includes one or more circuits 236 and conductive redistribution pads 238. In a non-limiting example, any of the conductive redistribution pads 238 may be conductively coupled to any of the one or more circuits 236. When the passive device assembly 202 is provided on the circuit board 208, the one or more conductive mounting pads 212 disposed on the lower surface 224 of the ground plane separation control substrate 216 are conductively coupled to the conductive redistribution pads 238. In this regard, the passive device 204 and the secondary passive device 230 may be conductively coupled to the one or more circuits 236 in the circuit board 208. In this regard, in a non-limiting example, the one or more conductive mounting pads 212 and the conductive redistribution pads 238 may be configured to provide a means for conductively coupling the passive device 204 to the one or more circuits 236 in the circuit board 208. As previously discussed, by including the embedded ground plane 206 inside the passive device assembly 202, it is possible to accurately control the separation distance $D_1$ between the passive device 204 and the embedded ground plane 206 to minimize the undesirable interference to the passive device 204. As a result, the passive device assembly 202 may be provided on the circuit board 208 regardless of the exact location of the ground plane 210 in the circuit board 208. This is contrasted with the conventional semiconductor package 100 in FIG. 1, wherein the location of the ground plane 114 inside the PCB 108 may vary from manufacturer to manufacturer, thus making it difficult to predict the exact location of the ground plane 114 and control the separation distance $D_0$ accurately. In this regard, the passive device assembly 202 is mounted onto the circuit board 208 via the one or more conductive mounting pads 212 for pin compatibility and precise alignment. In addition to conductively coupling the passive device assembly 202 to the circuit board 208, the one or more conductive mounting pads 212 may also function as thermal grounds to provide heat dissipation for the passive device assembly 202.

Figure 3:
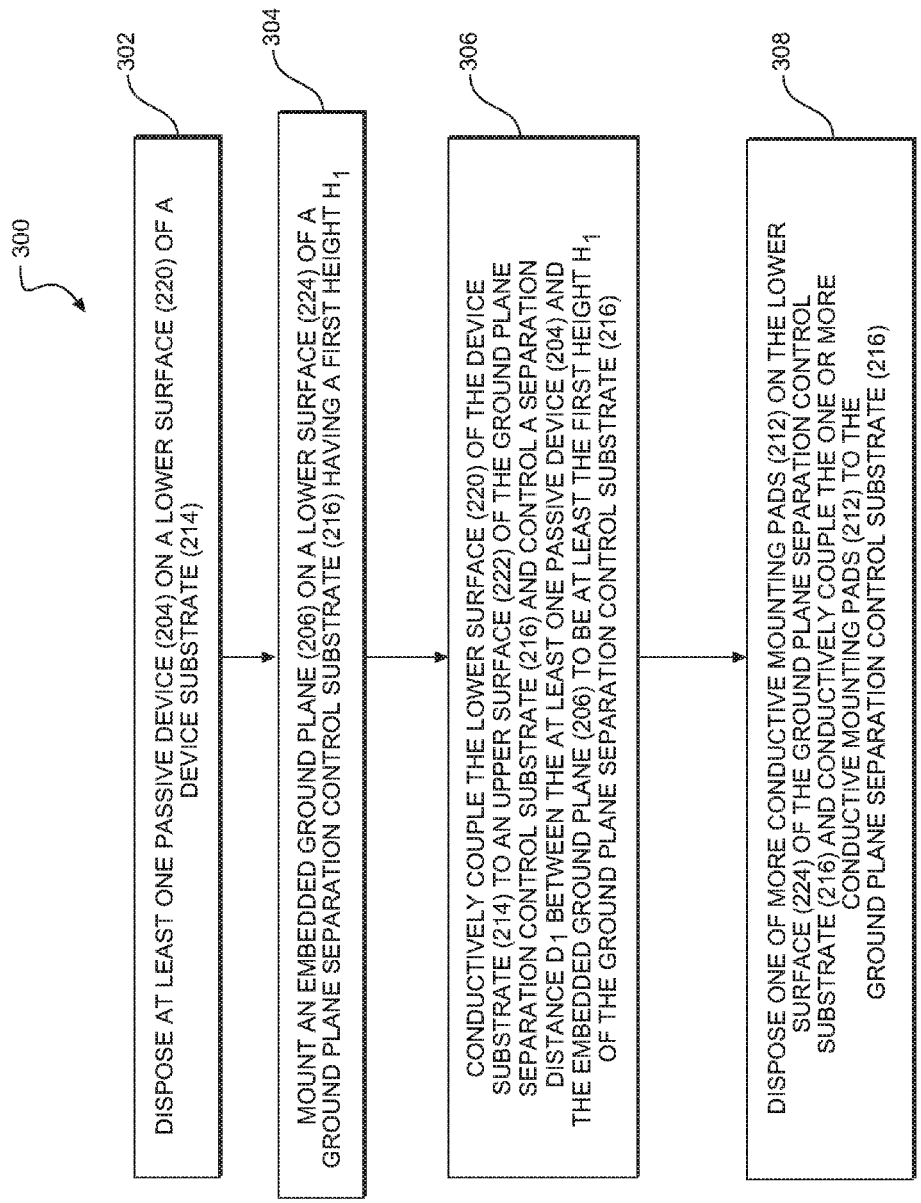
FIG. 3 is a flowchart of an exemplary process of fabricating the passive device assembly in FIG. 2.

FIG. 3 is a flowchart of an exemplary passive device assembly fabrication process 300 for fabricating the passive device assembly 202 of FIG. 2. According to the passive device assembly fabrication process 300, the passive device 204 is disposed on the lower surface 220 of the device substrate 214 (block 302). Then, the embedded ground plane 206 is mounted on the lower surface 224 of the ground plane separation control substrate 216 (block 304). The lower surface 220 of the device substrate 214 is conductively coupled to the upper surface 222 of the ground plane separation control substrate 216 and the separation distance $D_1$ between the passive device 204 and the embedded ground plane 206 is controlled to be at least the first height $H_1$ of the ground plane separation control substrate 216 (block 306). The one or more conductive mounting pads 212 are disposed on the lower surface 224 of the ground plane separation control substrate 216 and conductively coupled to the ground plane separation control substrate 216 (block 308).

Figure 4:
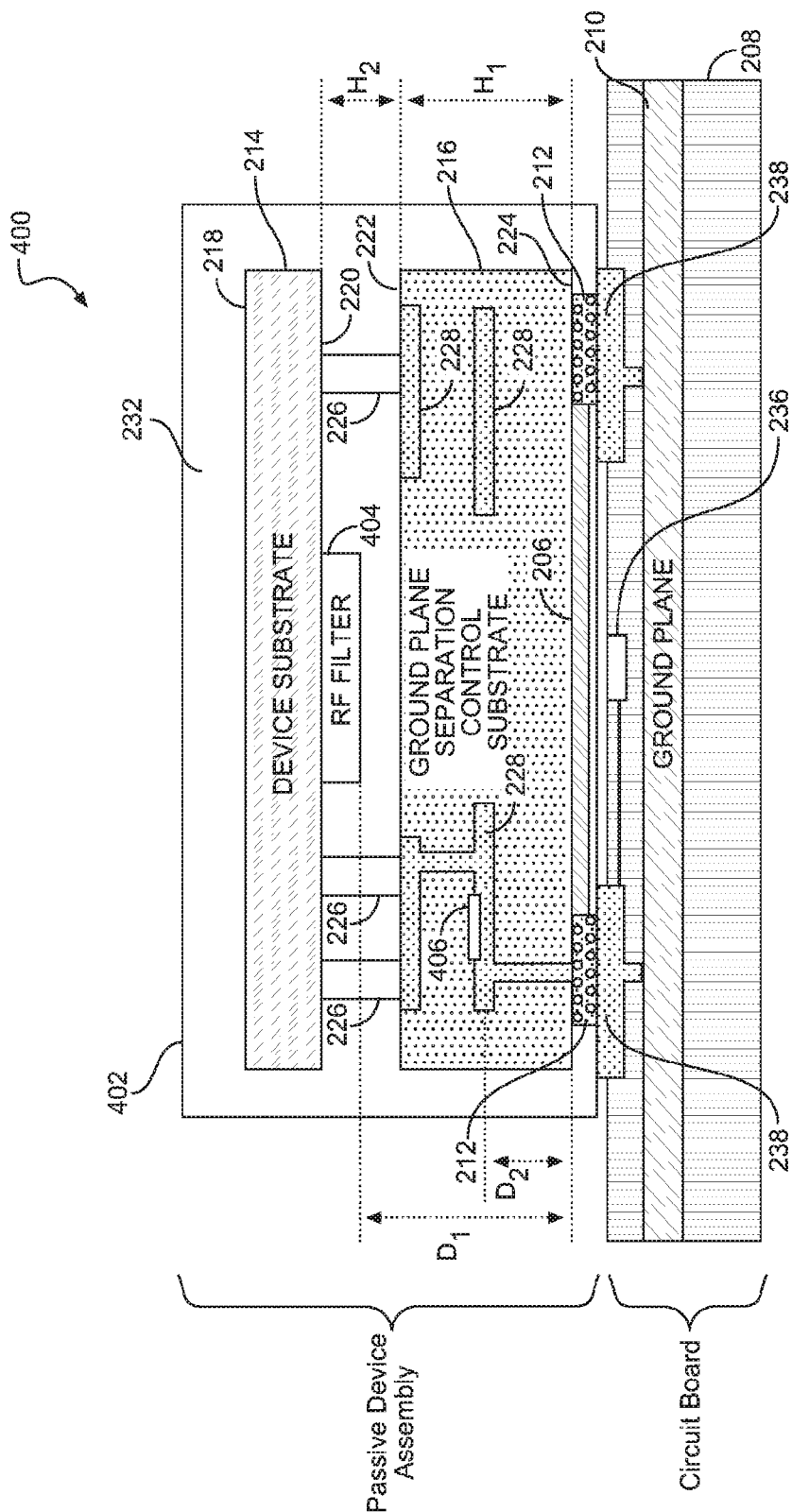
FIG. 4 is a schematic diagram of another exemplary circuit assembly including a passive radio frequency (RF) filter assembly configured to provide accurate ground plane control to minimize undesirable interference to at least one RF filter provided in the passive RF filter assembly.

With reference back to FIG. 2, in a non-limiting example, the passive device 204 and the secondary passive device 230 may be radio frequency (RF) filters (e.g., broadband RF filter, narrowband RF filter). In this regard, FIG. 4 is a schematic diagram of an exemplary circuit assembly 400 including a passive RF filter assembly 402 configured to provide accurate ground plane control to minimize undesirable interference to at least one RF filter 404 provided in the passive RF filter assembly 402. Common elements between FIGS. 2 and 4 are shown therein with common element numbers, and thus will not be re-described herein.

With reference to FIG. 4, the RF filter 404 is disposed on the lower surface 220 of the device substrate 214. The RF filter 404 is vertically separated from the embedded ground plane 206 by the separation distance $D_1$ that is at least the first height $H_1$ ($D_1 \geq H_1$). A secondary RF filter 406 is disposed on the conductive layer 228. The secondary RF filter 406 is vertically separated from the embedded ground plane 206 by the second separation distance $D_2$ that is less than the separation distance $D_1$ ($D_2 < D_1$). In this regard, the secondary RF filter 406 may be less susceptible to undesirable interference than the RF filter 404.

According to previous discussions in FIG. 2, by including the embedded ground plane 206 inside the passive RF filter assembly 402, it is possible to accurately control the separation distance $D_1$ between the RF filter 404 and the embedded ground plane 206 to minimize the undesirable interference to the RF filter 404. As a result, the passive RF filter assembly 402 may be provided on the circuit board 208 regardless of the exact location of the ground plane 210 in the circuit board 208. This is contrasted with the conventional semiconductor package 100 in FIG. 1, wherein the location of the ground plane 114 inside the PCB 108 may vary from manufacturer to manufacturer, thus making it difficult to predict the exact location of the ground plane 114 and control the separation distance $D_0$ accurately. In this regard, the passive RF filter assembly 402 is mounted onto the circuit board 208 via the one or more conductive mounting pads 212 for pin compatibility and precise alignment. In addition to conductively coupling the passive RF filter assembly 402 to the circuit board 208, the one or more conductive mounting pads 212 may also function as the thermal grounds to provide heat dissipation for the passive RF filter assembly 402.

Figure 5:
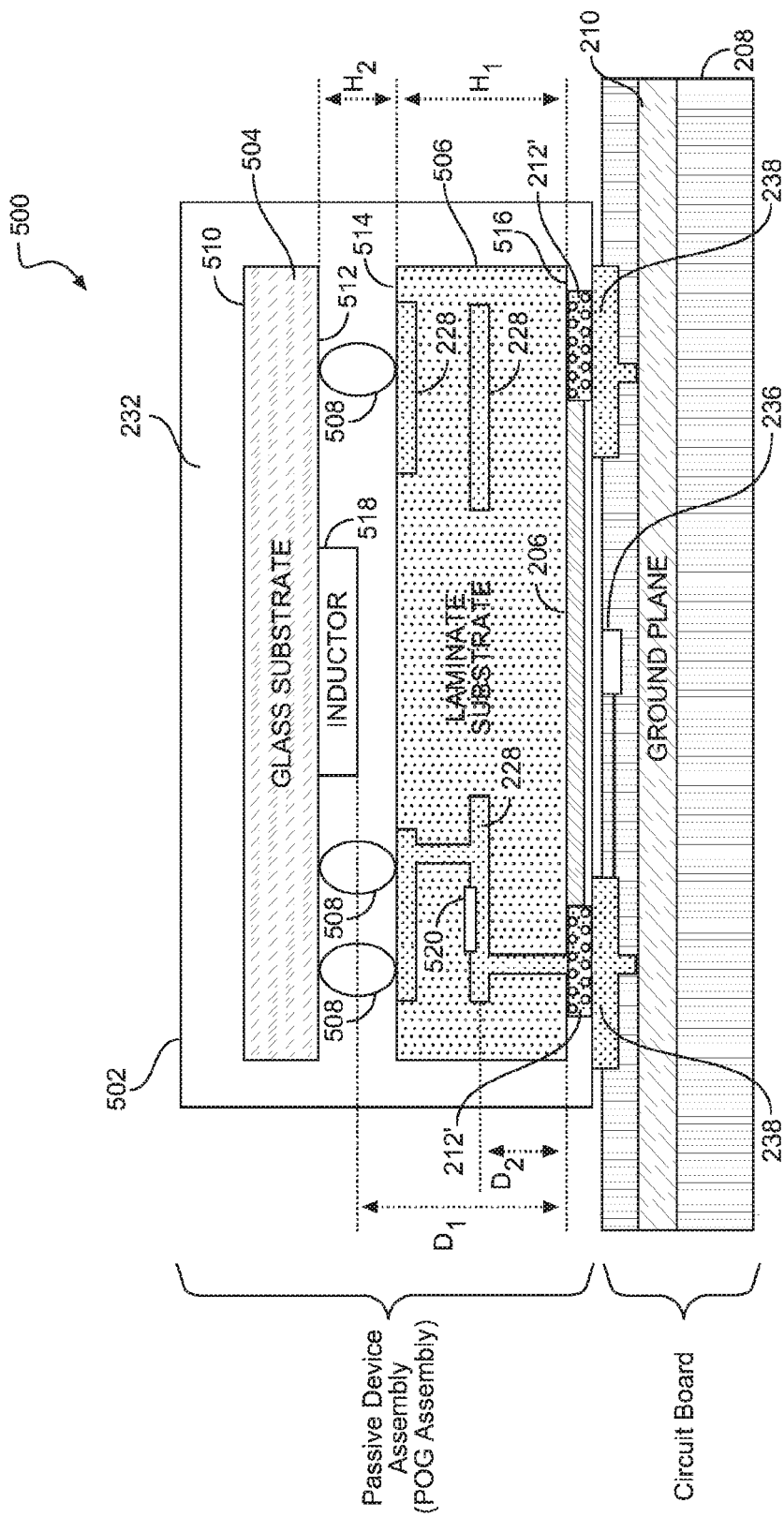
FIG. 5 is a schematic diagram of another exemplary circuit assembly including a passive-on-glass (POG) assembly configured to provide accurate ground plane control to minimize undesirable interference to at least one inductor provided in the POG assembly, wherein the POG assembly includes a glass substrate conductively coupled to a laminate substrate via a plurality of solder balls.

With reference back to FIG. 2, in a non-limiting example, the device substrate 214 may also be formed of glass, and the ground plane separation control substrate 216 may be formed of laminate, thus allowing one or more land grid array (LGA) pads to be provided on the lower surface 224 of the ground plane separation control substrate 216. In addition, by forming the ground plane separation control substrate 216 of laminate, it is possible to create the conductive layer 228 in the ground plane separation control substrate 216 with higher density and reliability. Furthermore, the plurality of conductive structures 226 may be provided in the form of solder balls. In this regard, FIG. 5 is a schematic diagram of an exemplary circuit assembly 500 including a passive-on-glass (POG) assembly 502 in which a glass substrate 504 is conductively coupled to a laminate substrate 506 via a plurality of solder balls 508. Common elements between FIGS. 2 and 5 are shown therein with common element numbers, and thus will not be re-described herein. In a non-limiting example, the laminate substrate 506 may be a substrate having an overlay material. In another non-limiting example, the laminate substrate 506 may be a laminate structure made from layers of material fixed together to form a hard, flat, and/or flexible material.

With reference to FIG. 5, the glass substrate 504 has an upper surface 510 and a lower surface 512. The laminate substrate 506 has an upper surface 514 and a lower surface 516. The plurality of solder balls 508 is disposed between the lower surface 512 of the glass substrate 504 and the upper surface 514 of the laminate substrate 506. Each of the plurality of solder balls 508 has the second height $H_2$. At least one inductor 518 is disposed on the lower surface 512 of the glass substrate 504 and separated from the embedded ground plane 206 by the separation distance $D_1$ to minimize undesirable inductance interference to the inductor 518. In this regard, the POG assembly 502 may also be referred to as a passive inductor assembly. At least one secondary inductor 520 is disposed on the conductive layer 228. The secondary inductor 520 is separated from the embedded ground plane 206 by the second separation distance $D_2$ that is less than the separation distance $D_1$ ($D_2 < D_1$). In this regard, the secondary inductor 520 may be less susceptible to the undesirable inductance interference than the inductor 518.

With continuing reference to FIG. 5, one or more LGA pads 212' may be provided on the lower surface 516 of the laminate substrate 506. In a non-limiting example, LGA is a packaging technology having a rectangular grid of contact pins (not shown) extending outward from the lower surface 516 of the laminate substrate 506. The one or more LGA pads 212' are a form of the one or more conductive mounting pads 212 of FIG. 2. As such, the one or more LGA pads 212' are conductively coupled to the conductive redistribution pads 238 of the circuit board 208 with a minimum amount of soldering in between the one or more LGA pads 212' and the conductive redistribution pads 238. As such, it is possible to minimize reflow degradation of the soldering between the one or more LGA pads 212' and the conductive redistribution pads 238. According to previous discussions in FIG. 2, by including the embedded ground plane 206 inside the POG assembly 502, it is possible to accurately control the separation distance $D_1$ between the inductor 518 and the embedded ground plane 206 to minimize the undesirable interference to the inductor 518. As a result, the POG assembly 502 may be provided on the circuit board 208 regardless of the exact location of the ground plane 210 in the circuit board 208. This is contrasted with the conventional semiconductor package 100 in FIG. 1, wherein the location of the ground plane 114 inside the PCB 108 may vary from manufacturer to manufacturer, thus making it difficult to predict the exact location of the ground plane 114 and control the separation distance $D_0$ accurately. In this regard, the POG assembly 502 is mounted onto the circuit board 208 via the one or more LGA pads 212' for pin compatibility and precise alignment. In addition to conductively coupling the POG assembly 502 to the circuit board 208, the one or more LGA pads 212' may also function as the thermal grounds to provide heat dissipation for the POG assembly 502.

Figure 6:
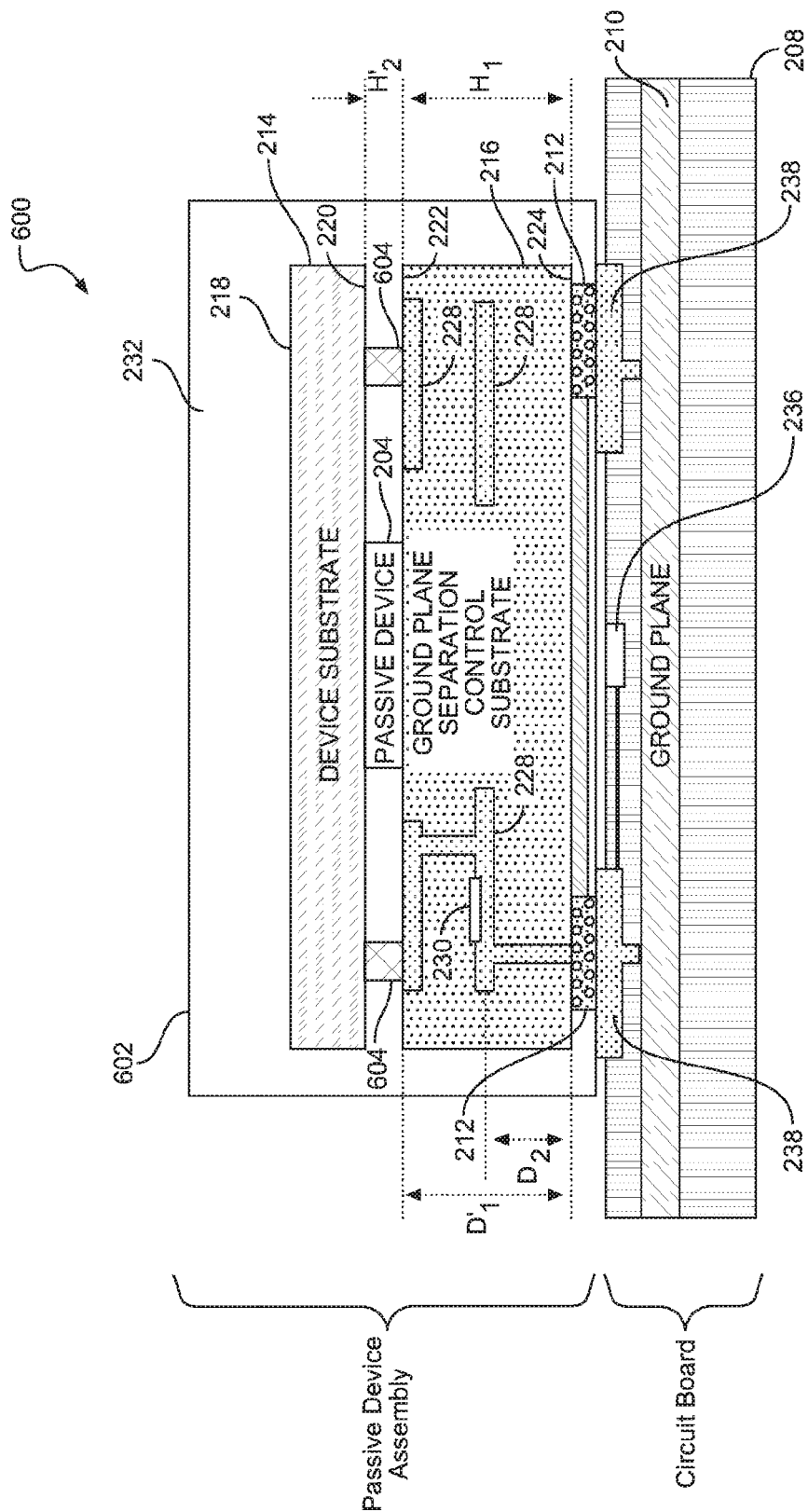
FIG. 6 is a schematic diagram of another exemplary circuit assembly including a passive device assembly having a reduced overall height from the passive device assembly of FIG. 2.

As previously discussed in the passive device assembly 202 in FIG. 2, the separation distance $D_1$ between the passive device 204 and the embedded ground plane 206 may be controlled to be at least the first height $H_1$ of the ground plane separation control substrate 216 ($D_1 \geq H_1$). As such, it may be desirable to reduce the overall height of the passive device assembly 202 by controlling the separation distance $D_1$ to be substantially closer to the first height $H_1$. In this regard, FIG. 6 is a schematic diagram of an exemplary circuit assembly 600 including a passive device assembly 602 having a reduced overall height from the passive device assembly 202 of FIG. 2. Common elements between FIGS. 2 and 6 are shown therein with common element numbers, and thus will not be re-described herein.

With reference to FIG. 6, the device substrate 214 is conductively coupled to the ground plane separation control substrate 216 by a plurality of conductive bonding structures 604 disposed between the lower surface 220 of the device substrate 214 and the upper surface 222 of the ground plane separation control substrate 216. In a non-limiting example, the plurality of conductive bonding structures 604 may be provided by materials such as eutectic gold. Each of the plurality of conductive bonding structures 604 has a height $H'_2$ that is substantially similar to a height (not shown) of the passive device 204. As such, a separation distance $D'_1$ between the passive device 204 and the embedded ground plane 206 is substantially close to the first height $H_1$. As a result, the overall height (not shown) of the passive device assembly 602 may be reduced.

The passive device assembly for accurate ground plane control, including without limitation the passive device assembly 202 of FIG. 2, the passive RF filter assembly 402 of FIG. 4, the POG assembly 502 of FIG. 5, and the passive device assembly 602 of FIG. 6, may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 7:
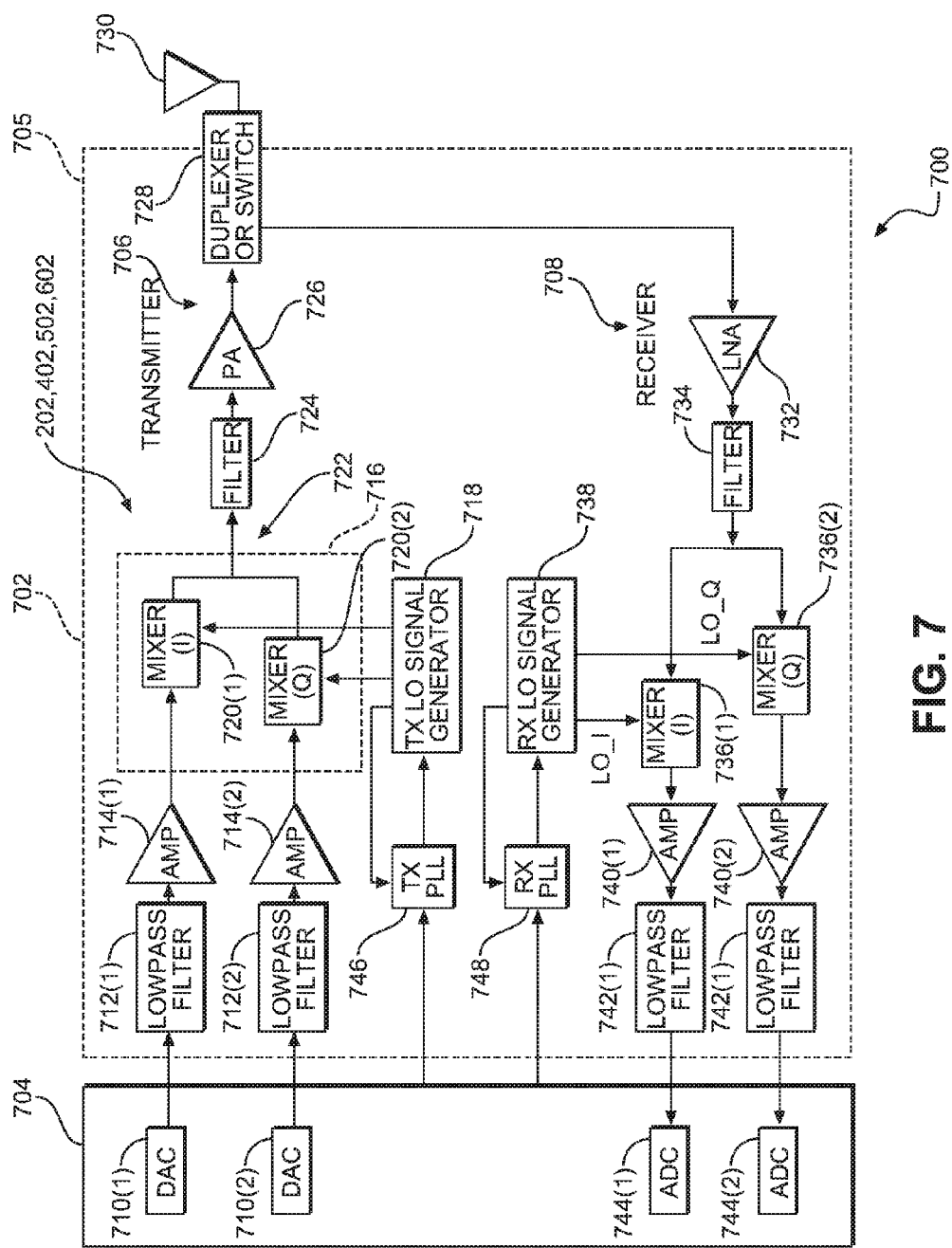
FIG. 7 illustrates an example of a wireless communications device which can include RF components in which the passive device assembly of FIG. 2, the passive RF filter assembly of FIG. 4, the POG assembly of FIG. 5, and the passive device assembly of FIG. 6 may be included.

In this regard, FIG. 7 illustrates an example of a wireless communications device 700 which can include RF components in which the passive device assembly 202 of FIG. 2, the passive RF filter assembly 402 of FIG. 4, the POG assembly 502 of FIG. 5, and the passive device assembly 602 of FIG. 6 may be included. As shown in FIG. 7, the wireless communications device 700 includes a transceiver 702 and a data processor 704. The transceiver 702, which may be provided in an RF transceiver integrated circuit (IC) 705, can be configured to include the passive device assembly 202 of FIG. 2, the passive RF filter assembly 402 of FIG. 4, the POG assembly 502 of FIG. 5, and the passive device assembly 602 of FIG. 6. The wireless communications device 700 may include or be provided in any of the above referenced devices, as examples.

The data processor 704 may include a memory (not shown) to store data and program codes. The transceiver 702 includes a transmitter 706 and a receiver 708 that support bi-directional communications. In general, the wireless communications device 700 may include any number of transmitters and/or receivers for any number of communication systems and frequency bands. All or a portion of the transceiver 702 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency-converted between RF and baseband in one stage. The super-heterodyne and direct-conversion architectures may use different circuit blocks and/or have different requirements. In the wireless communications device 700 in FIG. 7, the transmitter 706 and the receiver 708 are implemented with the direct-conversion architecture.

In the transmit path, the data processor 704 processes data to be transmitted and provides in-phase (I) and quadrature (Q) analog output signals to the transmitter 706. In the exemplary wireless communications device 700, the data processor 704 includes digital-to-analog-converters (DACs) 710(1), 710(2) for converting digital signals generated by the data processor 704 into the I and Q analog output signals, e.g., I and Q output currents, for further processing.

Within the transmitter 706, lowpass filters 712(1), 712(2) filter the I and Q analog output signals, respectively, to remove undesired images caused by the prior digital-to-analog conversion Amplifiers (Amp) 714(1), 714(2) amplify the signals from lowpass filters 712(1), 712(2), respectively, and provide I and Q baseband signals. An upconverter 716 upconverts the I and Q baseband signals with I and Q transmit (TX) local oscillator (LO) signals through mixers 720(1), 720(2) from a TX LO signal generator 718 to provide an upconverted signal 722. A filter 724 filters the upconverted signal 722 to remove undesired images caused by the frequency upconversion as well as noise in a receive frequency band. A power amplifier (PA) 726 amplifies a signal from the filter 724 to obtain the desired output power level and provides a transmit RF signal. The transmit RF signal is routed through a duplexer or switch 728 and transmitted via an antenna 730.

In the receive path, the antenna 730 receives signals transmitted by base stations and provides a received RF signal, which is routed through the duplexer or switch 728 and provided to a low noise amplifier (LNA) 732. The duplexer or switch 728 is designed to operate with a specific receive-to-transmit (RX-to-TX) duplexer frequency separation, such that RX signals are isolated from TX signals. The received RF signal is amplified by the LNA 732 and filtered by a filter 734 to obtain a desired RF input signal. Down-conversion mixers 736(1), 736(2) mix the output of filter 734 with I and Q RX LO signals (i.e., LO_I and LO_Q) from an RX LO signal generator 738 to generate I and Q baseband signals. The I and Q baseband signals are amplified by amplifiers 740(1), 740(2) and further filtered by lowpass filters 742(1), 742(2) to obtain I and Q analog input signals, which are provided to the data processor 704. In this example, the data processor 704 includes analog-to-digital-converters (ADCs) 744(1), 744(2) for converting the analog input signals into digital signals to be further processed by the data processor 704.

In the wireless communications device 700 in FIG. 7, the TX LO signal generator 718 generates the I and Q TX LO signals used for frequency upconversion, while the RX LO signal generator 738 generates the I and Q RX LO signals used for frequency downconversion. Each LO signal is a periodic signal with a particular fundamental frequency. A TX phase-locked loop (PLL) circuit 746 receives timing information from the data processor 704 and generates a control signal used to adjust the frequency and/or phase of the TX LO signals from the TX LO signal generator 718. Similarly, an RX phase-locked loop (PLL) circuit 748 receives timing information from the data processor 704 and generates a control signal used to adjust the frequency and/or phase of the RX LO signals from the RX LO signal generator 738.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A passive device assembly, comprising:
   a device substrate comprising an upper surface and a lower surface;
   at least one passive device disposed on the lower surface of the device substrate;
   a ground plane separation control substrate comprising an upper surface and a lower surface, the ground plane separation control substrate having a first height;
   an embedded ground plane mounted on the lower surface of the ground plane separation control substrate;
   wherein the lower surface of the device substrate is conductively coupled to the upper surface of the ground plane separation control substrate to control a separation distance between the at least one passive device and the embedded ground plane that is at least the first height of the ground plane separation control substrate; and
   one or more conductive mounting pads disposed on the lower surface of the ground plane separation control substrate and conductively coupled to the ground plane separation control substrate for conductively mounting the passive device assembly on a circuit board to conductively couple the at least one passive device to a circuit in the circuit board.

2. The passive device assembly of claim 1, further comprising a plurality of conductive structures each having a second height and disposed between the lower surface of the device substrate and the upper surface of the ground plane separation control substrate.

3. The passive device assembly of claim 2, wherein the separation distance between the at least one passive device and the embedded ground plane is controlled by the first height of the ground plane separation control substrate and the second height of the plurality of conductive structures.

4. The passive device assembly of claim 2, wherein the plurality of conductive structures is comprised of a plurality of solder balls.

5. The passive device assembly of claim 1, wherein the at least one passive device is comprised of at least one radio frequency (RF) filter.

6. The passive device assembly of claim 1, wherein the at least one passive device is comprised of at least one inductor.

7. The passive device assembly of claim 1, wherein the one or more conductive mounting pads are comprised of one or more pin grid array (PGA) pads.

8. The passive device assembly of claim 1, wherein the one or more conductive mounting pads are comprised of one or more land grid array (LGA) pads.

9. The passive device assembly of claim 1, wherein the device substrate is comprised of a glass substrate.

10. The passive device assembly of claim 1, wherein the ground plane separation control substrate is comprised of a laminate substrate.

11. The passive device assembly of claim 1, wherein the ground plane separation control substrate comprises at least one conductive layer conductively coupled to the one or more conductive mounting pads.

12. The passive device assembly of claim 11, wherein the at least one conductive layer is comprised of at least one metal layer.

13. The passive device assembly of claim 11, wherein the ground plane separation control substrate further comprises at least one secondary passive device disposed on the at least one conductive layer in the ground plane separation control substrate.

14. The passive device assembly of claim 13, wherein the at least one secondary passive device is comprised of at least one radio frequency (RF) filter.

15. The passive device assembly of claim 13, wherein the at least one secondary passive device is comprised of at least one inductor.

16. The passive device assembly of claim 1, further comprising an overmolding disposed around the device substrate and the ground plane separation control substrate.

17. The passive device assembly of claim 1, wherein the ground plane separation control substrate is comprised of a semiconductor substrate.

18. The passive device assembly of claim 1, wherein the ground plane separation control substrate is comprised of an organic substrate.

19. The passive device assembly of claim 1 integrated into a radio frequency (RF) transceiver integrated circuit (IC).

20. The passive device assembly of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

21. A circuit assembly, comprising:
   a passive device assembly, comprising:
      a device substrate comprising an upper surface and a lower surface;
      at least one passive device disposed on the lower surface of the device substrate;
      a ground plane separation control substrate comprising an upper surface and a lower surface, the ground plane separation control substrate having a first height;
      an embedded ground plane mounted on the lower surface of the ground plane separation control substrate;
      wherein the lower surface of the device substrate is conductively coupled to the upper surface of the ground plane separation control substrate to control a separation distance between the at least one passive device and the embedded ground plane that is at least the first height of the ground plane separation control substrate; and
      one or more conductive mounting pads disposed on the lower surface of the ground plane separation control substrate and conductively coupled to the ground plane separation control substrate; and
   a circuit board comprising one or more circuits and one or more conductive redistribution pads electrically coupled to the one or more circuits;
   wherein the one or more conductive mounting pads disposed on the lower surface of the ground plane separation control substrate are conductively mounted to the one or more conductive redistribution pads to conductively couple the at least one passive device to the one or more circuits in the circuit board.

22. The circuit assembly of claim 21, wherein the passive device assembly further comprises a plurality of conductive structures each having a second height and disposed between the lower surface of the device substrate and the upper surface of the ground plane separation control substrate.

23. The circuit assembly of claim 22, wherein the plurality of conductive structures is comprised of a plurality of solder balls.

24. The circuit assembly of claim 22, wherein the separation distance between the at least one passive device and the embedded ground plane is controlled by the first height of the ground plane separation control substrate and the second height of the plurality of conductive structures.

25. The circuit assembly of claim 21, wherein the at least one passive device is comprised of at least one radio frequency (RF) filter.

26. The circuit assembly of claim 21, wherein the at least one passive device is comprised of at least one inductor.

27. The circuit assembly of claim 21, wherein the one or more conductive mounting pads are comprised of one or more pin grid array (PGA) pads.

28. The circuit assembly of claim 21, wherein the one or more conductive mounting pads are comprised of one or more land grid array (LGA) pads.

29. The circuit assembly of claim 21, wherein the device substrate is comprised of a glass substrate.

30. The circuit assembly of claim 21, wherein the ground plane separation control substrate is comprised of a laminate substrate.

31. The circuit assembly of claim 21, wherein the ground plane separation control substrate comprises at least one conductive layer conductively coupled to the one or more conductive mounting pads.

32. The circuit assembly of claim 31, wherein the at least one conductive layer is comprised of at least one metal layer.

33. The circuit assembly of claim 31, wherein the ground plane separation control substrate further comprises at least one secondary passive device disposed on the at least one conductive layer in the ground plane separation control substrate.

34. The circuit assembly of claim 33, wherein the at least one secondary passive device is comprised of at least one radio frequency (RF) filter.

35. The circuit assembly of claim 33, wherein the at least one secondary passive device is comprised of at least one inductor.

36. The circuit assembly of claim 21, wherein the ground plane separation control substrate is comprised of a semiconductor substrate.

37. The circuit assembly of claim 21, wherein the ground plane separation control substrate is comprised of an organic substrate.

* * * * *